US010177297B2

(12) United States Patent
Marcus et al.

(10) Patent No.: US 10,177,297 B2
(45) Date of Patent: Jan. 8, 2019

(54) SEMICONDUCTOR JOSEPHSON JUNCTION AND A TRANSMON QUBIT RELATED THERETO

(71) Applicant: University of Copenhagen, København N (DK)

(72) Inventors: Charles M. Marcus, København Ø (DK); Peter Krogstrup, København Ø (DK); Thomas Sand Jespersen, København Ø (DK); Jesper Nygård, København Ø (DK); Karl Petersson, København Ø (DK); Thorvald Larsen, København Ø (DK); Ferdinand Kuemmeth, København Ø (DK)

(73) Assignee: University of Copenhagen (DK)

( * ) Notice: Subject to any disclaimer, the term of this patent is extended or adjusted under 35 U.S.C. 154(b) by 0 days.

(21) Appl. No.: 15/322,705

(22) PCT Filed: Mar. 4, 2015

(86) PCT No.: PCT/EP2015/054522
§ 371 (c)(1),
(2) Date: Dec. 28, 2016

(87) PCT Pub. No.: WO2016/000836
PCT Pub. Date: Jan. 7, 2016

(65) Prior Publication Data
US 2017/0133576 A1    May 11, 2017

(30) Foreign Application Priority Data

Jul. 2, 2014 (EP) .................................... 14175342
Feb. 10, 2015 (EP) .................................... 15154459

(51) Int. Cl.
*H01L 29/06* (2006.01)
*H01L 39/02* (2006.01)
(Continued)

(52) U.S. Cl.
CPC .............. *H01L 39/02* (2013.01); *B82Y 10/00* (2013.01); *B82Y 40/00* (2013.01); *C23C 14/28* (2013.01);
(Continued)

(58) Field of Classification Search
CPC .......... H01L 39/2493–39/2496; H01L 39/025; H01L 39/00; H01L 39/08; H01L 39/22–39/226
(Continued)

(56) References Cited

U.S. PATENT DOCUMENTS 5,057,485 A    10/1991 Nishino et al.
2002/0179937 A1    12/2002 Ivanov et al.
(Continued)

FOREIGN PATENT DOCUMENTS

WO    WO 03/019683 A2    3/2003

OTHER PUBLICATIONS

Roddaro et al. "Hot-electron effects in InAs nanowire Josephson junctions", Mar. 2011, Nano Research.*
(Continued)

*Primary Examiner* — Kevin M Picardat
(74) *Attorney, Agent, or Firm* — Sunstein Kann Murphy & Timbers LLP

(57) ABSTRACT

The present disclosure relates to semiconductor based Josephson junctions and their applications within the field of quantum computing, in particular a tuneable Josephson junction device has been used to construct a gateable transmon qubit. One embodiment relates to a Josephson junction comprising an elongated hybrid nanostructure comprising superconductor and semiconductor materials and a weak link, wherein the weak link is formed by a semiconductor
(Continued)

segment of the elongated hybrid nanostructure wherein the superconductor material has been removed to provide a semiconductor weak link.

20 Claims, 11 Drawing Sheets

(51) Int. Cl.
| | |
|---|---|
| B82Y 10/00 | (2011.01) |
| B82Y 40/00 | (2011.01) |
| H01L 29/43 | (2006.01) |
| H01L 29/66 | (2006.01) |
| H01L 39/24 | (2006.01) |
| H01L 29/41 | (2006.01) |
| H01L 39/22 | (2006.01) |
| H01L 39/12 | (2006.01) |
| C23C 14/28 | (2006.01) |
| C30B 11/12 | (2006.01) |
| C30B 23/02 | (2006.01) |
| C30B 23/06 | (2006.01) |
| C30B 29/62 | (2006.01) |

(52) U.S. Cl.
CPC ............ *C30B 11/12* (2013.01); *C30B 23/025* (2013.01); *C30B 23/066* (2013.01); *C30B 29/62* (2013.01); *H01L 29/0673* (2013.01); *H01L 29/413* (2013.01); *H01L 29/437* (2013.01); *H01L 29/66469* (2013.01); *H01L 39/025* (2013.01); *H01L 39/125* (2013.01); *H01L 39/221* (2013.01); *H01L 39/223* (2013.01); *H01L 39/228* (2013.01); *H01L 39/2432* (2013.01); *H01L 39/2493* (2013.01); *Y10S 977/762* (2013.01); *Y10S 977/81* (2013.01); *Y10S 977/891* (2013.01); *Y10S 977/938* (2013.01); *Y10S 977/943* (2013.01)

(58) Field of Classification Search
USPC .......................................................... 257/34
See application file for complete search history.

(56) References Cited

U.S. PATENT DOCUMENTS

| | | | |
|---|---|---|---|
| 2003/0042481 A1 | 3/2003 | Tzalenchuk et al. | |
| 2005/0123674 A1* | 6/2005 | Stasiak ................ | B82Y 10/00 427/62 |
| 2008/0272302 A1* | 11/2008 | Frey ..................... | B82Y 20/00 250/336.2 |
| 2009/0274609 A1* | 11/2009 | Harutyunyan ........ | B82Y 30/00 423/445 B |
| 2010/0144535 A1* | 6/2010 | Strachan ............. | B81C 1/00126 505/100 |
| 2012/0112168 A1* | 5/2012 | Bonderson ........... | G06N 99/002 257/31 |
| 2015/0143817 A1* | 5/2015 | Gervais ................. | H01L 23/34 62/3.1 |

OTHER PUBLICATIONS

Krogstrup et al. "Epitaxial aluminum contacts to InAs nanowires", Sep. 2013.*
Mourik, et al., "Signatures of Majorana Fermions in Hybrid Superconductor-Semiconductor Nanowire Devices," Science, vol. 336, pp. 1003-1007, May 25, 2012.
Rokhinson, et al., "The fractional a.c. Josephson effect in a semiconductor-superconductor nanowire as a signature of Majorana particles," Nature Physics, vol. 8, pp. 795-799, Nov. 2012.
Xiang, et al., "Ge/Si nanowire mesoscopic Josephson junction," Nature Nanotechnology, vol. 1, pp. 208-213, Dec. 2006.
Ziino, et al., "Epitaxial aluminum contacts to InAs nanowires," https://arxiv.org/abs/1309.4569, 14 pages, Sep. 18, 2013.
International Searching Authority, European Patent Office, International Search Report and Written Opinion, International Application No. PCT/EP2015/054522, 15 pages, dated May 27, 2015.

* cited by examiner (a)

(b)

(c)

| Domain fraction ZB//FCC | | ½ | 1/3 | 2/3 | ¼ | 3/4 | 1/5 | 2/5 | 3/5 | 4/5 |
|---|---|---|---|---|---|---|---|---|---|---|
| FCC metal | Lattice const. | 0.5 | 0.333 | 0.667 | 0.25 | 0.75 | 0.2 | 0.4 | 0.6 | 0.8 |
| Ne | 4.43 | 31.6 | 54.4 | 8.8 | 65.8 | 2.6 | 72.6 | 45.3 | 17.9 | 9.4 |
| Al | 4.05 | 25.2 | 50.1 | 0.3 | 62.6 | 12.2 | 70.1 | 40.2 | 10.2 | 19.7 |
| Ar | 5.26 | 42.4 | 61.6 | 23.2 | 71.2 | 13.6 | 77.0 | 53.9 | 30.9 | 7.9 |
| Ca | 5.58 | 45.7 | 63.8 | 27.6 | 72.9 | 18.6 | 78.3 | 56.6 | 34.9 | 13.1 |
| Ni | 3.52 | 13.9 | 42.6 | 14.7 | 57.0 | 29.1 | 65.6 | 31.2 | 3.3 | 37.7 |
| Cu | 3.61 | 16.1 | 44.1 | 11.9 | 58.0 | 25.9 | 66.4 | 32.9 | 0.7 | 34.3 |
| Kr | 5.72 | 47.0 | 64.7 | 29.4 | 73.5 | 20.6 | 78.8 | 57.6 | 36.5 | 15.3 |
| Sr | 6.08 | 50.2 | 66.8 | 33.6 | 75.1 | 25.3 | 80.1 | 60.1 | 40.2 | 20.3 |
| Rh | 3.8 | 20.3 | 46.9 | 6.3 | 60.1 | 19.6 | 68.1 | 36.2 | 4.3 | 27.5 |
| Pd | 3.89 | 22.1 | 48.1 | 3.8 | 61.1 | 16.8 | 68.9 | 37.7 | 6.6 | 24.6 |
| Ag | 4.09 | 25.9 | 50.6 | 1.3 | 63.0 | 11.1 | 70.4 | 40.8 | 11.1 | 18.5 |
| Xe | 6.2 | 51.1 | 67.4 | 34.9 | 75.6 | 26.7 | 80.5 | 60.9 | 41.4 | 21.8 |
| Ce | 5.16 | 41.3 | 60.9 | 21.7 | 70.6 | 11.9 | 76.5 | 53.0 | 29.6 | 6.1 |
| Yb | 5.49 | 44.8 | 63.2 | 26.4 | 72.4 | 17.2 | 77.9 | 55.9 | 33.8 | 11.7 |
| Ir | 3.84 | 21.1 | 47.4 | 5.2 | 60.6 | 18.3 | 68.4 | 36.9 | 5.3 | 26.2 |
| Pt | 3.92 | 22.7 | 48.5 | 3.0 | 61.4 | 15.9 | 69.1 | 38.2 | 7.3 | 23.6 |
| Au | 4.08 | 25.8 | 50.5 | 1.0 | 62.9 | 11.4 | 70.3 | 40.6 | 10.9 | 18.8 |
| Pb | 4.95 | 38.8 | 59.2 | 18.4 | 69.4 | 8.2 | 75.5 | 51.0 | 26.6 | 2.1 |
| Ac | 5.31 | 43.0 | 62.0 | 23.9 | 71.5 | 14.4 | 77.2 | 54.4 | 31.5 | 8.7 |
| Th | 5.08 | 40.4 | 60.2 | 20.5 | 70.2 | 10.6 | 76.1 | 52.3 | 28.4 | 4.6 |
| ZB//BCC | | | | | | | | | | |
| Li | 3.49 | 13.2 | 42.1 | 15.7 | 56.6 | 30.2 | 65.3 | 30.6 | 4.2 | 38.9 |
| Na | 4.23 | 28.4 | 52.3 | 4.5 | 64.2 | 7.4 | 71.4 | 42.7 | 14.1 | 14.6 |
| K | 5.23 | 42.1 | 61.4 | 22.8 | 71.0 | 13.1 | 76.8 | 53.7 | 30.5 | 7.3 |
| V | 3.02 | 0.3 | 33.1 | 33.7 | 49.8 | 50.5 | 59.9 | 19.8 | 20.4 | 60.5 |
| Cr | 2.88 | 5.2 | 29.9 | 40.2 | 47.4 | 57.8 | 57.9 | 15.9 | 26.2 | 68.3 |
| Fe | 2.87 | 5.5 | 29.6 | 40.7 | 47.2 | 58.3 | 57.8 | 15.6 | 26.7 | 68.9 |
| Rb | 5.59 | 45.8 | 63.9 | 27.7 | 72.9 | 18.7 | 78.3 | 56.6 | 35.0 | 13.3 |
| Nb | 3.3 | 8.2 | 38.8 | 22.4 | 54.1 | 37.7 | 63.3 | 26.6 | 10.2 | 46.9 |
| Mo | 3.15 | 3.8 | 35.9 | 28.2 | 51.9 | 44.2 | 61.5 | 23.1 | 15.4 | 53.9 |
| Cs | 6.05 | 49.9 | 66.6 | 33.2 | 75.0 | 24.9 | 80.0 | 59.9 | 39.9 | 19.9 |
| Ba | 5.02 | 39.7 | 59.8 | 19.5 | 69.8 | 9.5 | 75.9 | 51.7 | 27.6 | 3.5 |
| Eu | 4.61 | 34.3 | 56.2 | 12.4 | 67.1 | 1.4 | 73.7 | 47.4 | 21.2 | 5.1 |
| Ta | 3.31 | 8.5 | 39.0 | 22.0 | 54.2 | 37.3 | 63.4 | 26.8 | 9.8 | 46.4 |
| W | 3.16 | 4.1 | 36.1 | 27.8 | 52.1 | 43.8 | 61.7 | 23.3 | 15.0 | 53.4 |

Fig. 9

| Domain fraction | ½ | 1/3 | 2/3 | 1/4 | 3/4 | 1/5 | 2/5 | 3/5 | 4/5 |
|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

Fig. 10

| Domain fraction | ½ | 1/3 | 2/3 | 1/4 | 3/4 | 1/5 | 2/5 | 3/5 | 4/5 |
|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

Fig. 11

SEMICONDUCTOR JOSEPHSON JUNCTION AND A TRANSMON QUBIT RELATED THERETO

CROSS-REFERENCE TO RELATED APPLICATIONS

This application is a U.S. National Stage application of International Application No. PCT/EP2015/054522 filed Mar. 4, 2015, which claims priority to EP 14175342.6 filed Jul. 2, 2014 and EP 15154459.0 filed Feb. 10, 2015, the entire contents of each of which are hereby incorporated by reference herein, for all purposes.

TECHNICAL FIELD

The present disclosure relates to semiconductor based Josephson junctions and their applications within the field of quantum computing, in particular a tuneable Josephson junction device has been used to construct a gateable transmon qubit.

BACKGROUND ART

The fundamental element of a quantum computer is the quantum bit—also known as the "qubit". As opposed to a classical bit, representing zero and one, a qubit is also able to represent a quantum superposition of the two states. Hence, the states can be formalized within the laws of quantum physics, with a probability. Accordingly, the states can be manipulated and observed within the laws of quantum physics.

A number of physical objects have been suggested as potential implementations of qubits. However, solid-state circuits, and superconducting circuits in particular, are of great interest as they offer scalability—a possibility of making circuits with a larger number of interacting qubits. Superconducting qubits are typically based on Josephson junctions (JJ). A Josephson junction is basically two superconductors coupled by a weak link. The weak link can for example be a thin insulating barrier, a short section of non-superconducting metal, or a physical constriction that weakens the superconductivity at the point of contact.

A Josephson junction can be fabricated by means an insulating $Al_2O_3$ tunnel barrier, i.e. the weak link, between superconducting electrodes. For such superconductor-insulator-superconductor (SIS) Josephson junctions, the maximum allowed supercurrent, the critical current, $I_C$, and the Josephson coupling energy, $E_J = \hbar I_C/2e$, where e is the electron charge, are determined by the JJ area and insulator thickness and fixed by sample fabrication.

One of the first qubits to be realized was a charge qubit: a single cooper pair box. The single cooper pair box consists of a small island, connected to a superconducting reservoir through a JJ on one side and biased by a gate capacitance $C_g$ and a gate voltage $V_g$ on the other side. When the junction is in its superconducting state, Cooper pairs can tunnel to and from the island. The potential of the island can be controlled through the gate voltage. In addition to the Josephson coupling energy, the single cooper pair box can also be characterized by the Coulomb energy of the Cooper pair, i.e. the charging energy, given as $E_C = e^2/2C_T$, where $C_T$ represents the total capacitance between the island and its circuit, i.e. $C_T = C_g + C_J$, where $C_J$ is the capacitance of the JJ.

Superconducting qubits having a tunable critical current and based on Josephson junctions are preferred in the field of quantum computing, and have been realized using a so-called superconducting quantum interference device (SQUID), which allow $E_J$ to be tuned by means of an external magnetic field.

The SQUID is based on an add-on to the single cooper box, in that it for example may have a JJ added in parallel to the JJ of the single cooper pair box, thereby forming a loop, through which a magnetic field can be applied. In this configuration, the SQUID is a so-called DC-SQUID. The typical charge qubit, being the simple single cooper pair box, is thus obsolete, at least because it is non-tunable.

Several problems are however related to a tuneable qubit, in particular to an external magnetic field as applied in order to tune the qubit. First of all, an external magnetic field could decrease the ratio of the Josephson energy and the charging energy, thereby introducing sensitivity to charge noise. Secondly, magnetic flux could be entrapped in the system. Thirdly, it could be inconvenient to place a magnet in close vicinity of one or more qubits. Finally, it could be complex to manage the magnetic field for interacting qubits.

SUMMARY OF EMBODIMENTS

In order to overcome the problems related to tuning a qubit, in particular to tuning the Josephson coupling energy using an external magnetic field, the present disclosure presents a completely different setup for a tuneable qubit. The present disclosure provides in particular a setup that does not require an external magnetic field for tuning a qubit. Thus, the present disclosure provides an alternative and better solution for tuning the Josephson coupling energy.

The present disclosure relates in a first aspect to a Josephson junction comprising an elongated hybrid nanostructure comprising superconductor and semiconductor materials and a weak link, wherein the weak link is formed by a semiconductor segment of the elongated hybrid nanostructure wherein the superconductor material has been removed to provide a semiconductor weak link.

Thus, the present disclosure can be seen as a modification of the typical JJ, being a superconductor-insulator-superconductor (SIS) JJs, to a superconductor-normal-superconductor (SNS) JJ, i.e. by replacing the insulator (I) with a normal element (N), where the normal element is a semiconductor material.

An effect of having a semiconductor material instead of an insulator is that such configuration allows the Josephson coupling energy, $E_j$, to be tuned by an electric field which controls the carrier density of the normal element and thereby the coupling of superconducting electrodes. Hence, the Josephson energy can be controlled though depletion of a semiconductor. Consequently the present disclosure provides a solution for tuning the Josephson coupling energy by means of non-magnetic fields, thereby overcoming the problems related to magnetic fields in the vicinity of for example qubits.

A second aspect of the present invention relates in general to a tuneable Josephson device comprising the Josephson junction as just described and an electrostatic side gate located adjacent to the weak link of the Josephson junction and configured to apply and control a voltage across the weak link.

A third aspect of the present invention relates to a side gate controlled charge qubit comprising a superconducting island, a superconducting electrode, a Josephson junction interconnecting the island and the electrode, the Josephson junction comprising a semiconductor weak link and an electrostatic side gate, and a main gate voltage coupling the superconducting island and the superconducting electrode by means of a main gate capacitance. The charge qubit is preferably configured such that the electron density in the semiconductor weak link is controlled by tuning the voltage of the electrostatic side gate.

A typical charge qubit, or the single cooper pair box, comprises a superconducting island, a superconducting electrode, a Josephson junction interconnecting the island and the electrode, the Josephson junction comprising a weak link, and a main gate voltage coupling the superconducting island and the superconducting electrode by means of a main gate capacitance. Thus, the side gate controlled charge qubit, according to the present invention, differs from a typical charge qubit in that the Josephson junction comprises a semiconductor weak link and an electrostatic side gate. An effect of these differences is that they allow the side gate controlled charge qubit to be configured such that the electron density in the semiconductor weak link is controlled by tuning the voltage of the electrostatic side gate. By definition, a charge qubit is limited by an energy ratio, $E_J/E_C$, being much smaller than 1.

A fourth aspect of the present invention relates to a side gate controlled transmon qubit comprising a superconducting island, a superconducting electrode, a Josephson junction interconnecting the island and the electrode, the Josephson junction comprising a semiconductor weak link and an electrostatic side gate, a shunting capacitance shunting the superconducting island to ground, and a main gate voltage coupling the superconducting island and the superconducting electrode by means of a main gate capacitance. Again the transmon qubit is preferably configured such that the electron density in the semiconductor weak link is controlled by tuning the voltage of the electrostatic side gate. I.e. the transmon qubit may be configured such that control of the Josephson energy is provided through depletion in the semiconductor weak link by tuning the voltage of the electrostatic side gate.

A typical transmon qubit differs from a typical charge qubit in that it further comprises a shunting capacitance. In other words, a transmon qubit is a special type of charge qubit. The shunting capacitance is responsible for lowering the charge energy, $E_C$. This means that the energy ratio, $E_J/E_C$, is no longer within the charge qubit definition, and enters a new regime, known as the transmon regime. Thus, a transmon qubit is by definition a qubit, where $E_J \gg E_C$, or more specifically, where $E_J/E_C \geq 20$.

With this definition of a transmon qubit, the presently disclosed side gate controlled transmon qubit differs from the presently disclosed side gate controlled charge qubit, by a shunting capacitance shunting the superconducting island of the transmon qubit to ground.

A typical transmon qubit is conventionally configured with a JJ having a SIS configuration. In addition, a typical transmon qubit is also conventionally configured with two JJs, typically in a DC-SQUID configuration. The side gate controlled transmon qubit according to the present invention thus greatly differs from a typical transmon qubit. An effect of the features defined by the side gate controlled transmon qubit according to the present invention is that scaling to many qubits is much simplified. For example, a typical transmon qubit, requiring superconducting current loops, implies first of all that a large current is required, and that complex control electronics must pass into the cryogenic environment through normal coax lines, filters and attenuators. This may be avoided using the present invention. On-chip voltage pulses, i.e. related to tuning a qubit using voltage, are relatively easily screened compared to flux pulses, and will reduce cross-talk between qubit control lines. The main advantage of the present invention is the new ability to control the Josephson energy, and hence the transmon qubit frequency, though depletion of a semiconductor, resembling control of the conductance in a field-effect transistor, thereby linking the new field of quantum computing with well-established semiconductor technology. Tuneable Josephson junctions have been realized and used to construct and realize a side gate controlled transmon qubit which is demonstrated in the examples herein.

A fifth aspect of the present invention relates to a method for producing a Josephson junction from a hybrid semiconductor superconductor nanostructure.

DESCRIPTION OF DRAWINGS

FIG. 9 is a table listing domain matching for InAs with different cubic metals in the [11-2] out-of-plane orientation.

FIG. 10 is a table listing domain matching for InSb with different cubic metals in the [11-2] out-of-plane orientation.

FIG. 11 is a table listing domain matches for GaAs with different cubic metals in the [11-2] out-of-plane orientation.

DETAILED DESCRIPTION OF SPECIFIC EMBODIMENTS

Figure 1:
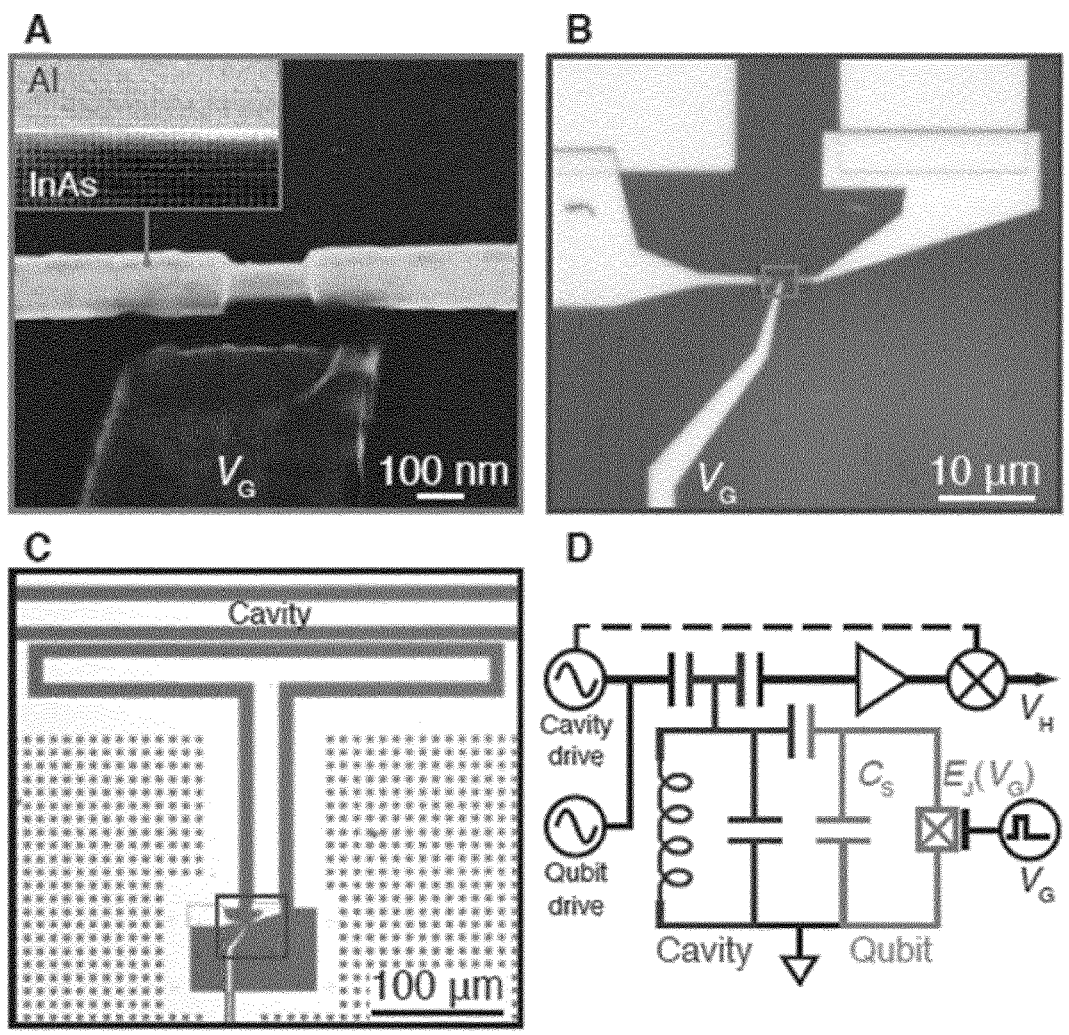
FIG. 1 shows an example of a side gate controlled transmon qubit according to the present invention.

As previously stated a first aspect of the present disclosure relates to a Josephson junction comprising an elongated hybrid nanostructure comprising superconductor and semiconductor materials and a weak link, wherein the weak link is formed by a semiconductor segment of the elongated hybrid nanostructure wherein the superconductor material has been removed to provide a semiconductor weak link. The elongated hybrid nanostructure may be seen as forming a superconducting wire and the JJ is formed from this wire by forming a weak link by having a non-superconducting semiconductor segment where through Cooper pairs can tunnel under appropriate conditions. An important element of the present disclosure is therefore the hybrid nanostructure comprising semiconductor and superconductor materials, where an epitaxial match between the crystalline structures of the semiconductor nanostructure and the first facet layer may be provided and configured to induce a superconductor hard gap in the semiconductor nanostructure, and will be described in the following.

Hybrid Nanostructure

One key aspect when integrating superconductor and semiconductor technology has been the realization of an almost perfect interface between a semiconductor and a superconductor in the form of a metal, in particular a hybrid nanostructure with InAs and Al. Semiconductor/metal (SE/M) interfaces has so far been uncontrolled on the atomic scale. However, nanoscale device (or nanometer scale) comprising an elongated crystalline semiconductor nanostructure, such as a nanowire (crystal) or nanowhisker (crystal) or nanorod (crystal), with epitaxial interfaces between the semiconductor and a metal has been disclosed in Krogstrup et al., "Epitaxy of semiconductor-superconductor nanowires", Nature Materials (2015) and pending applications EP 14175342 (filed 2 Jul. 2014) and EP 15154459 (filed 10 Feb. 2015), and may be incorporated herein in their entirety.

These nanoscale devices have been realized and exemplified by means of bottom-up growth of semiconductor/metal core-shell nanowire crystals by a combination of VLS and molecular beam epitaxy (MBE). One example uses InAs for the nanowire crystal and Al is grown with epitaxially matched single plane interfaces, which can be regarded as the ultimate limit of disorder free contact. Under certain conditions, conventional superconductors can induce a topological non-trivial superconducting state in semiconductor nanowires. Proposals based on proximity effect in semiconductor nanowires with strong spin-orbit are appealing because the key ingredients are known in the art. However, all previous instances of proximitized semiconductors show significant tunneling conductance below the superconducting gap, suggesting a continuum of subgap states that nullifies topological protection—an unsolved issue referred to as the "soft gap problem". Such soft-gaps will induce decoherence of Majorana qubits, and has been considered a major road-block for the future of topological quantum information in such devices. But it turns out that the hardness of the induced superconductivity depends crucially on the quality and uniformity of the semiconductor/superconductor (SE/SU) interfaces. This situation is analogous to that of conventional semiconductor devices where the quality of the involved interfaces is the primary parameter determining the performance. For this reason, semiconductor technology was revolutionized by the invention of epitaxial growth of heterostructures, which enables atomic-scale design of semiconductor interfaces and tailor-made profiles of the electronic band structures, doping levels and strain. So far, however, the world of semiconductor epitaxy has had little to do with the world of superconductivity.

But with the advent of the InAs nanowires with epitaxial Al it has been demonstrated that for temperatures below the superconducting transition temperature aluminum becomes superconducting and the Al shell induces a superconducting gap into the InAs by virtue of the proximity effect. In contrast to all previous studies, however, the induced gap remains hard i.e., free of sub-gap states, likely due to the perfectly uniform InAs//Al interface. The soft-gap problem has therefore been solved, because a hard superconducting gap induced by proximity effect in a semiconductor, is demonstrated by using epitaxial Al—InAs superconductor-semiconductor hybrid nanowires.

An elongated crystalline nanostructure may be in the form a nanowire (crystal) or nanowhisker (crystal) or nanorod (crystal). It may be provided with one or more substantially plane side facets. The terms "nanowire" and "nanowire crystal" may be used "interchangeably" herein, as it may be implicitly understood that the nanowires mentioned herein are crystalline structures.

The hybrid nanostructures used herein for Josephson junctions are typically superconducting along the longitudinal direction of the nanostructure, e.g. like a superconducting wire, and the weak link to be used in the JJ is created by removing superconducting material from a segment of the hybrid nanostructure thereby breaking the superconducting properties in a small segment of the nanostructure.

In one embodiment the elongated hybrid nanostructure comprises an elongated crystalline semiconductor nanostructure having at least one substantially plane side facet, and a crystalline superconductor first facet layer deposited on at least one side facet along at least part of the length of the crystalline semiconductor nanostructure, wherein the crystalline structure of the semiconductor nanostructure is epitaxially matched with the crystalline structure of the first facet layer on the interface formed between the semiconductor nanostructure and the crystalline superconductor. The weak link is formed by a semiconductor segment of the elongated hybrid nanostructure where the first facet layer has been removed to provide a semiconductor weak link.

In a further embodiment the elongated hybrid nanostructure comprises an elongated crystalline semiconductor nanostructure having a plurality of substantially plane side facets, and a crystalline superconductor first facet layer covering one or more of said plane side facets of at least part of the length of the crystalline semiconductor nanostructure, wherein the crystalline structure of the semiconductor nanostructure is epitaxially matched with the crystalline structure of the first facet layer on the interface of at least one side facet, and wherein the weak link is formed by a semiconductor segment of the elongated hybrid nanostructure where the first facet layer has been removed to provide a semiconductor weak link.

The elongated crystalline nanostructure may be provided in a semiconducting material, e.g. a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations. The facet layer may naturally be a metal but may be many types of materials. Further, the facet layer may be provided in a material with superconducting properties below a critical temperature $T_c$. A preferred crystalline semiconductor nanostructure may be InAs, in particular because InAs nanostructures allow for high quality field effect JJs due to the highly transparent Schottky barrier-free SN interface.

The elongated semiconductor nanostructure is crystalline, i.e. it is a single crystal or it is composed of several crystals, e.g. large single crystal elements, forming a crystalline structure. In some embodiments the elongated crystalline nanostructure may be seen as a substantially one-dimensional crystalline structure. It has been demonstrated in InAs with an Al facet layer with Wurtzite (WZ)/FCC or Zinc Blende (ZB)/FCC crystal orientations, which can form uniform crystal morphologies and highly ordered and well defined epitaxial SE/M interfaces between the semiconductor (SE, e.g. InAs) and the metal (M, e.g. Al). However, the epitaxial match can be realized with other material combinations with similar structures and lattice spacings. For relevant FCC metals this could for example be Au and Ag, and for semiconductors this is for example the other members of the '6.1 Å family': GaSb and AlSb. Hence, high quality epitaxial growth of contacts to elongated crystalline nanostructures can therefore be realized with many material combinations.

Having an epitaxial match between the semiconductor and the superconductor has at least one major effect. The superconductor first facet layer forms an atomically precise SN interface leading to a proximity induced gap in the semiconductor nanostructure with a low density of states below the superconducting gap. In other words, the epitaxial match generates a hard gap.

In one embodiment of the invention each two-dimensional interface between a side facet of the elongated crystalline nanostructure and the first facet layer is lattice matched and/or domain matched in at least one dimension, possibly in both dimensions.

Naturally the first facet layer may crystalline. The two-dimensional interface between a side facet of the crystalline nanostructure and the first facet layer may be epitaxial. Even further the two-dimensional interfaces between each side facet of the crystalline nanostructure and the first facet layer may be epitaxial, such as simultaneously epitaxially matched. Thus, the crystalline structure of the nanostructure may be epitaxially matched with the crystalline structure of the first facet layer. As also stated previously each two-dimensional interface between a side facet of the crystalline nanostructure and the first facet layer may be domain matched and/or lattice matched in at least one dimension, preferably in both dimensions. Thus, in one embodiment each two-dimensional interface between the side facet(s) of the crystalline nanostructure and the first facet layer is simultaneously epitaxially matched, domain matched and lattice matched in both dimensions.

Epitaxial match in the interface between two crystalline layers may not be entirely unusual if the crystal structures of the two crystalline layers are equal. However, in this case the inventors have demonstrated that an epitaxial interface can be realised even when the crystal structure (and/or crystal phase) of the elongated crystalline nanostructure is different from the crystal structure (and/or crystal phase) of the first facet layer, such as when the crystal structure (and/or crystal phase) of the elongated crystalline nanostructure and the crystal structure (and/or crystal phase) of the first facet layer belong to different lattice systems and/or if the Bravais lattice of the elongated crystalline nanostructure is different from the Bravais lattice of the first facet layer. If for example the crystal structure of the elongated crystalline nanostructure is zincblende (ZB) then the crystal structure of the first facet layer is not zincblende, i.e. the crystal structures are different. Correspondingly if for example the crystal structure of the elongated crystalline nanostructure is wurtzite then the crystal structure of the first facet layer is not wurtzite, i.e. the crystal structures are different. E.g. the crystal structure of the elongated crystalline nanostructure may be zincblende (ZB) or wurtzite (WZ) and the crystal structure of the facet layer belongs to the cubic crystal system, such as primitive cubic, BCC or FCC, as demonstrated herein with InAs nanowires (ZB or WZ) with an Al (FCC) epitaxially matched first facet layer.

In further embodiment the first facet layer comprises one or more large single crystal segments wherein the interface between the elongated crystalline nanostructure and said single crystal segment(s) is epitaxially matched, such as simultaneously epitaxially matched on all side facets.

The elongated crystalline nanostructure may be homogeneous, i.e. formed from the same compound material in the longitudinal/axial direction and/or in the radial direction. However, the elongated crystalline nanostructure may in itself be a heterogeneous structure, e.g. a heterostructured nanowire crystal. E.g. the crystalline nanostructure may be a heterostructured nanowire crystal composed of different compounds in the axial and/or radial direction.

As previously stated it is unusual that an epitaxial interface is provided between layers having different crystal structures and this opens for epitaxial interfaces between semiconductors (which are often wurtzite or zincblende) and metals (which are often BCC or FCC). In one embodiment the facet layer is hence a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W. Some of these metals become superconducting below a critical temperature. However, facet layers of other materials may as well be provided where an epitaxial interface to the elongated crystalline nanostructure can be realised, e.g. selected from the group of high temperature ceramic superconductors, such as copper oxide or cuprate superconductors, which are often having a perovskite crystal structure.

The cross-section of the elongated crystalline nanostructure may e.g. be square, hexagonal, or octagonal providing a total of four, six or eight side facets, respectively. Consequently, the facet layer may be covering at least a part of 1, 2, 3, 4, 5, 6, 7, 8 or more of the side facets.

The thickness of the first facet layer may be less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

At the initial stage of the growth of the first facet layer islands may form at the elongated crystalline nanostructure surface. During this growth the temperature of the substrate may play an important role with regard to the spacing between the islands. If the temperature is low enough, the spacing is so small that the islands will merge at a very thin thickness of the first facet layer. As discussed further below this may lead to surface driven grain growth. A thickness of the first facet layer below 15 nm may only be obtained if the temperature during growth/deposition of the facet layer is below −20° C., or below −25° C., or even below −30° C.

The diameter of the elongated crystalline nanostructure may be between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

The length of the elongated crystalline nanostructure may be between 1 and 20 μm, or between 1 and 2 μm, or between 2 and 3 μm, or between 3 and 4 μm, or between 4 and 5 μm, or between 5 and 6 μm, or between 6 and 7 μm, or between 7 and 8 μm, or between 8 and 9 μm, or between 9 and 10 μm, or between 10 and 12 μm, or between 12 and 14 μm, or between 14 and 16 μm, or between 16 and 18 μm, or between 18 and 20 μm.

In one embodiment of the present invention, the length of the semiconductor segment is between 10 and 500 nm, or between 20 and 400 nm, or between 40 and 300 nm, more preferably between 100 and 250 nm, most preferably between 150 and 200 nm.

In yet another embodiment of the present invention, the cross-section of the crystalline semiconductor nanostructure is square, thereby providing a total of four side facets or hexagonal, thereby providing a total of six side facets.

In some embodiments of the present invention, the diameter of the crystalline semiconductor nanostructure is between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

In other embodiments of the present invention, the length of the crystalline semiconductor nanostructure is between 1 and 20 µm, or between 1 and 2 µm, or between 2 and 3 µm, or between 3 and 4 µm, or between 4 and 5 µm, or between 5 and 6 µm, or between 6 and 7 µm, or between 7 and 8 µm, or between 8 and 9 µm, or between 9 and 10 µm, or between 10 and 12 µm, or between 12 and 14 µm, or between 14 and 16 µm, or between 16 and 18 µm, or between 18 and 20 µm.

Second Facet Layer

Other superconductors have different advantageous properties, such as higher critical temperatures and in particular higher critical magnetic fields, than those offered by aluminum. As a superconductor aluminum has a critical transition temperature Tc of approx. 1.3 Kelvin and a low critical magnetic field Bc. For many applications other superconductors with higher Tc and Bc are desired. For example, niobium has a Tc of ~9 Kelvin and vanadium Tc of ~5 Kelvin; using these elements as superconductors would therefore enable superconducting devices operating above liquid helium temperature (4 Kelvin) making them much more attractive for various superconducting applications. Also, niobium and vanadium has high Bc enabling the operation of superconducting devices in the presence of a sizable (order Tesla) field scale as needed for e.g., topological quantum information with Majorana Fermion bound states. Other superconductors and alloys have even higher Tc and Bc.

Figure 6:
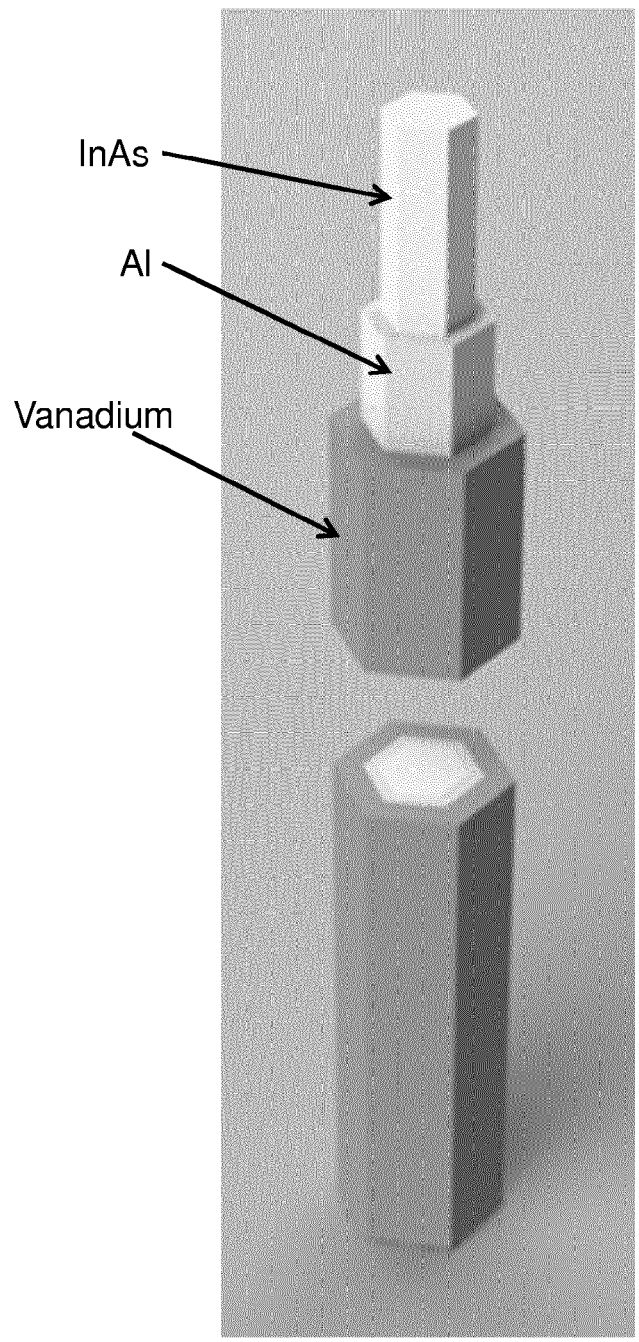
FIG. 6 illustrates the principle of depositing a second facet layer on to the (first) facet layer, in this case a layer of vanadium has been deposited onto a full shell hybrid nanoscale device with InAs/Al.

However, it can be difficult to find a semiconductor material where an epitaxial match with these other types of superconductors is obtainable. Another ingenious option may then be to use the first facet layer, e.g. in the form of epitaxially matched aluminum, as a coupling layer for interfacing a second facet layer to the hybrid nanostructure, e.g. a second facet layer in the form of another type of material, alloy, or metal that become superconducting below $T_c$. In a further embodiment the presently disclosed hybrid nanostructure therefore comprises a second facet layer located on the outside or covering at least a part of the first facet layer. FIG. 6 illustrates the principle of depositing a second facet layer directly on to the first facet layer, in this case a layer of vanadium has been deposited onto a full shell hybrid with InAs/Al.

The first facet layer may have a crystalline structure which is epitaxially matched with the crystalline structure of the nanostructure. In this case the structure of the second facet layer is not necessarily important, i.e. second facet layer may have a crystalline structure which is or is not epitaxially matched with the crystalline structure of the nanostructure. The second facet layer may even have an amorphous structure. But the epitaxial match between the crystalline structures of the semiconductor nanostructure and the first facet layer is preferably configured to induce a superconductor hard gap in the semiconductor nanostructure with the superconducting properties of the second facet layer. That is the main advantage of the second facet layer.

The crystalline nanostructure may be provided in a semiconducting material, the first facet layer may be provided in a first material with superconducting properties below a first critical temperature, and the second facet layer may be provided in a second material with superconducting properties below a second critical temperature.

The material of the second facet layer may be selected among a list of materials that becomes superconducting below a critical temperature and such lists are known in the art, e.g. it may be selected from the group of superconducting ceramic materials, in particular cuprates such as YBCO ($YBa_2Cu_3O_{7-x}$) or superconducting alloys. There are many types of superconducting alloys known in the art and which can be employed here, such as $MgB_2$, niobium alloys such as NiTi and NbTiN with various fractions of Ti and N, and $Zr_{100-x}M_x$ where x is any number in the range of 0 to 100 and M is a metal selected from the group of Fe, Co, Ni, Cu, Ru, Rh, Pd, Os, Ir, Pt and Au.

The crystalline nanostructure is preferably provided in a semiconducting material, such as selected from the collection of group III-V combinations, such as InAs, InP, InSb, GaAs, GaSb, AlSb and InGaAs, or group IV elements such as Si or Ge, or group IV combinations such as SiGe, or group II-VI combinations such as ZnO, ZnSe and CdSe, or group I-VII combinations.

The main advantage of first and second facet layers solution is that by proximity effect the combined first and second facet layers can effectively appear as a superconductor with the superconducting properties of the second facet layer but with the epitaxial matching properties of the first facet layer. E.g. in the case of an InAs nanowire with an epitaxially matched first facet layer of Al and with a non-epitaxially matched second facet layer of vanadium on top of the first facet layer, the hard gap induced from the Al due to the epitaxial matching between InAs and Al will also be induced from the Vanadium layer by means of the vanadium-aluminum-InAs proximity effect thereby obtaining a superconducting device with a hard gap and a $T_c$ of approx. 5 Kelvin corresponding to the $T_c$ of vanadium. The first facet layer need only have a thickness of a few nanometers whereas the second facet layer can be much thicker. Furthermore, the first+second facet layer approach will work for many types of hybrid nanostructure, e.g. both full-shell and half-shell hybrids. It is furthermore relatively straightforward to make a superconducting contact between the first and the second facet layers, e.g. if using metals. Furthermore, the second facet layer can be deposited by many different processes, e.g. evaporation, sputtering, pulsed laser deposition or chemical vapour deposition, all of which are less complicated and less time consuming than MBE. The solution with first and second facet layers thus provides a route to making hard induced gaps from arbitrary metals, materials or alloys.

Prior to the deposition of the second facet layer the surface of the first facet layer may need chemical cleaning, e.g. in the form of chemical etching or mechanical cleaning, e.g. in the form of ion-milling, plasma cleaning, etc., in order to facilitate contacts to the second facet layer. In the example disclosed herein the surface of the Al was argon-milled to remove the Al-oxide which was present as the samples had seen ambient conditions (oxygen) between the two depositions. Cleaning is typically not needed if the sample is kept in vacuum between the deposition of two facet layers.

The second facet layer can for example be added on to the first facet layer by conventional evaporation or sputtering after cleaning the exposed surface of the first facet layer by chemical or mechanical methods if needed. The interface between the first and second facet layers will then consequently not be perfect. However, in case of e.g. high electron densities in the two layers a hard-gap contact is easy to form, for example with the case of a metal-metal interface. If the thickness of the first facet layer is much less than the thickness of the second facet layer and also much less than the coherence length in the first facet layer (which e.g. for aluminum is on the order of micrometers) then the resulting combination of the first and second facet layers will appear as a superconductor with Tc and Bc near those of the second facet layer, and at the same time with the epitaxial properties of the first facet layer thereby enabling an induced hard gap in the semiconductor. The thickness of the second facet layer is easy to control and may be from a few nanometers and up to whatever is appropriate for the specific application, e.g. between 5 and 500 nm, or between 10 and 200 nm, or between 20 and 100 nm.

Once the epitaxial first facet layer has been provided, the surface of the first facet layer surface can be cleaned to remove e.g. oxides. Argon ion milling can for example be provided to remove the oxide on the first facet layer surface. However, the cleaning is not needed if the starting thin shell device has never been exposed to air. Subsequently thicker superconductor second facet layer of any choice can be deposited by for example standard electron-beam evaporation.

Figure 7:
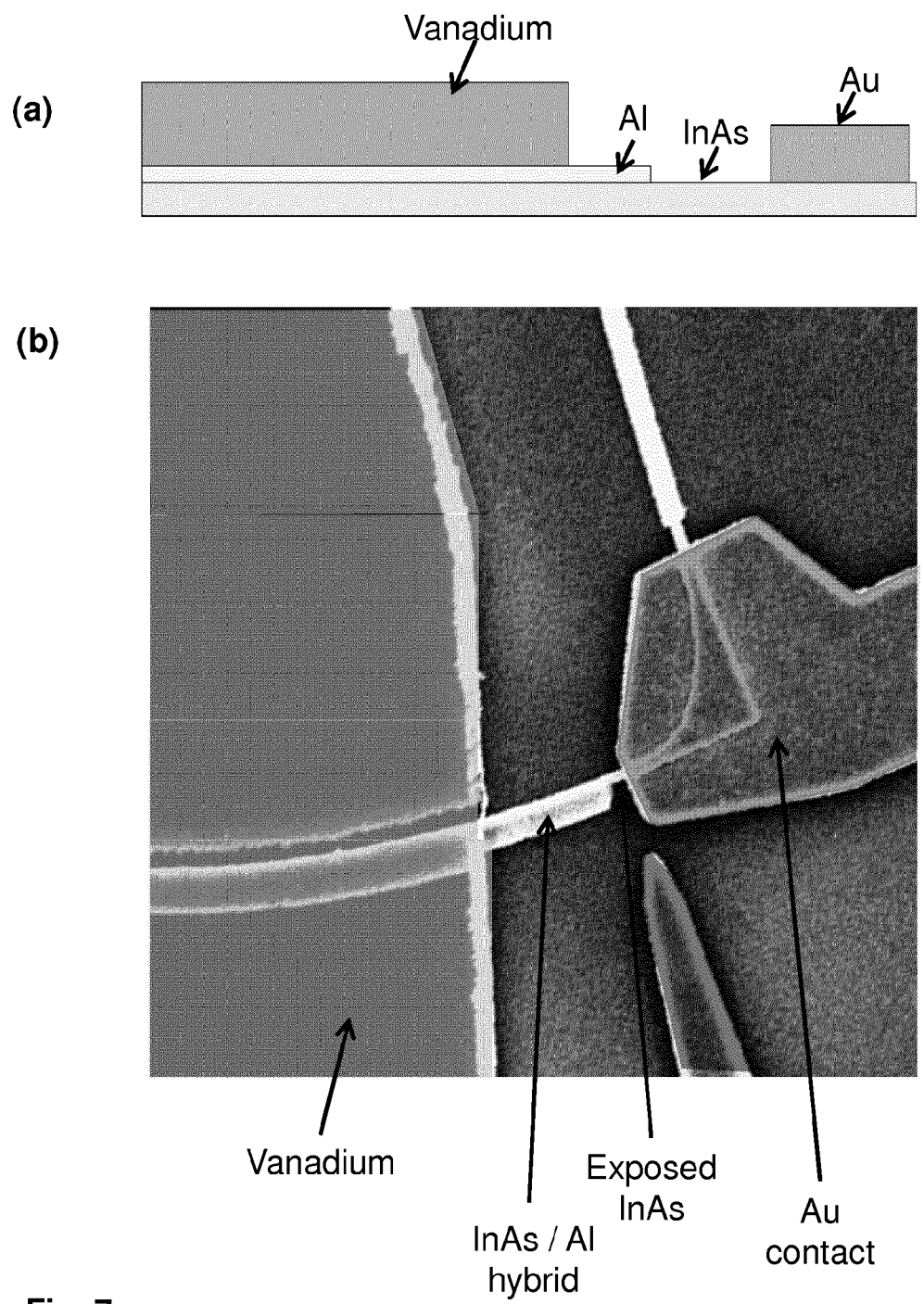
FIG. 7a illustrates the schematic principle of an actual device with two facet layers and a gold contact.
FIG. 7b shows a picture of an actual device with two facet layers and a gold contact.
Figure 8:
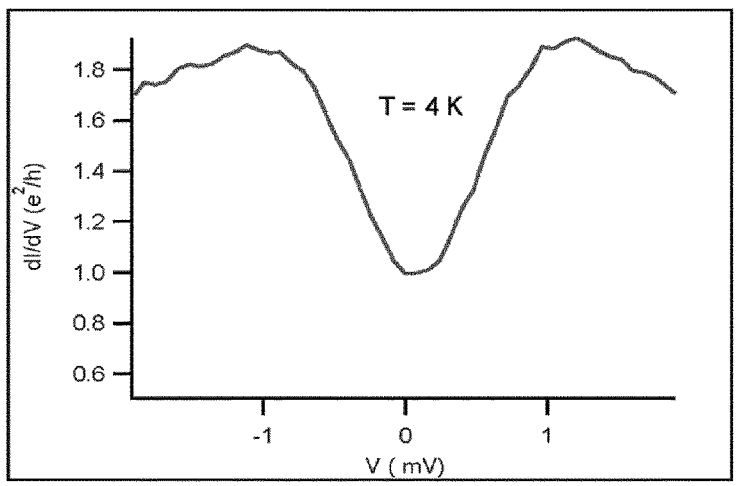
FIG. 8 shows measurements of the gap properties of the device in FIG. 7b.
Figure 8:
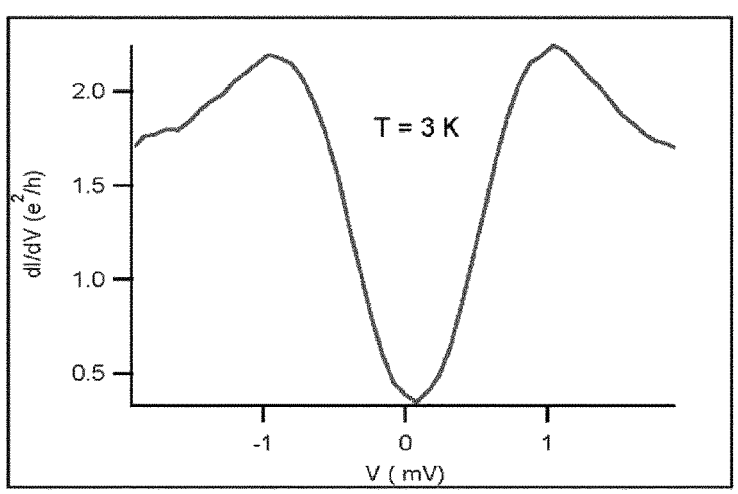
Figure 8:
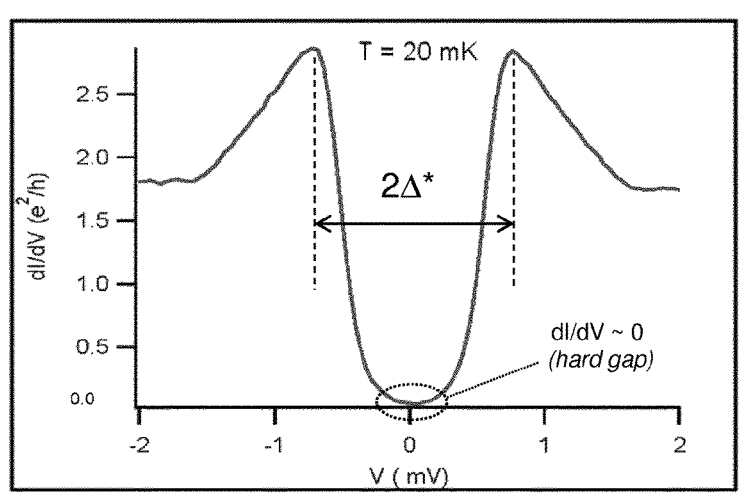

A hybrid structure with double facet layers has been realized and characterized. FIG. 7a illustrates the schematic principle of an actual device with two facet layers (aluminium and vanadium) and a gold contact. FIG. 7b shows a picture of the actual device. The gap properties of the device in FIG. 7b has been measured and are illustrated in FIG. 8a-c. The gap is appearing above 4 Kelvin. At low temperatures the gap is a hard gap (factor~100) with a gap magnitude of $\Delta^*=700$ meV which is almost four times larger than that of aluminum in the case of a single facet layer device.

For some compounds making a good contact between the first and second facet layers may be a problem. For example the ceramic high-Tc superconductors need oxygen when deposited as the second facet layer, which will inevitably oxidize the first facet layer in the case of e.g. aluminum. In such cases, adding a thin (approx. 0.3-10 nanometers) layer of an inert materiel, such as gold or another inert metal, such as Platinum, Iridium, Palladium, Osmium, Silver, Rothenium or Rhodium, in order to form a spacer between the first and second facet layers, is desirable in order to protect the surface of the first facet layer. In a further embodiment hybrid nanostructure therefore comprises a third facet layer (or intermediate layer or interface layer) located between the first facet layer and the second facet layer. The third facet layer is preferably an inert material, such as a Noble metal, such as Gold or Platinum or Iridium or Palladium or Osmium or Silver or Rothenium or Rhodium. Further, the thickness of the third facet layer is less than 10 nm, or less than 5 nm, or less than 4 nm, or less than 3 nm, or less than 2 nm, or less than 1 nm, or less than 0.5 nm. In case of e.g. Gold it can be added directly in the MBE or subsequently by evaporation. If the thickness of the third facet layer is thin enough the properties of the triple layers (first, third and second facet layers) will remain dominated by the thicker second facet layer.

Tuneable Josephson Device

In relation to the second aspect of the present invention, relating to a tuneable Josephson device, the electrostatic side gate may be configured to control the electron density in the semiconductor weak link by tuning the voltage of the electrostatic side gate (thereby determining the critical current and the coupling energy in the Josephson junction). The device may for example be low-power cryogenic electronics, a magnetic field sensor such as used in magnetoencephalography and/or such as used in voltage-frequency standards, and radiation detectors such as used in astronomy.

The electrostatic side gate may be configured to control the Josephson energy through depletion in the semiconductor weak link by tuning the voltage of the electrostatic side gate.

Charge Qubit

In relation to the third aspect of the present invention, relating to a charge qubit, in particular a side gate controlled charge qubit, the Josephson junction in the charge qubit, may the Josephson junction as described in above in relation to the first aspect of the present invention.

Transmon Qubit

In relation to the fourth aspect of the present invention, relating to a transmon qubit, in particular a side gate controlled transmon qubit, the Josephson junction in the transmon qubit, may the Josephson junction as described in above in relation to the first aspect of the present invention.

In some embodiments of the present invention, the side gate controlled transmon qubit may be coupled to superconducting transmission line cavity, such as $\lambda/2$, the transmission line cavity may for example have a bare resonance frequency between 1 and 10 GHz, for example approximately 6 GHz. Further, the transmission line may have a quality factor between 1000 and 2000, such as 1500.

The cavity may be used for dispersive readout of the qubit with detection, such as homodyne detection.

Method for Growing Nanowires

Elongated crystalline semiconductor nanostructures may be grown at elevated temperatures, e.g. above 300° C., above 350° C., or above 400° C., e.g. in the normal direction on a plane substrate. Importantly the first facet layer is grown/deposited directly on at least one plane surface of the crystalline semiconductor nanostructure at a much reduced temperature compared to what has previously been tried, e.g. below 50° C. or below 20° C. To provide a thin first facet layer, e.g. on the order of 10 nm, the temperature can be reduced even further, i.e. below 0° C., or below −5° C., or below −10° C., or below −15° C., or below −20° C., or below −25° C., or below −30° C. The reduction in temperature may also help to prevent any material sticking at the semiconductor surface before the first facet layer is deposited. An oxide free interface between the surface of the semiconductor and the first facet layer is thereby obtained, i.e. an oxide free epitaxial interface/contact between a semiconductor nanostructure and a metal/superconductor can be obtained. As demonstrated, nanowires grown in the conventional $[0001]_{WZ}/[111]_{ZB}$ direction have a facet layer in the form of a cubic metal phase with the [11-2] normal to the side facets of the nanowire and [111] along the nanowire axis. This is indeed unique because the symmetry allows large single crystal segments with simultaneous epitaxial match on all facets of the nanowire.

The inventors have realized that if the first facet layer is deposited at very low temperature it is possible to grow a first facet layer such that the two-dimensional interface between the facet layer and the elongated crystalline nanostructure is epitaxially matched, even when the nanostructure and the first facet layer have fundamentally different crystal structures. This opens the door for epitaxial matches between semiconductors and metals on the plane surfaces of hybrid nanostructures, like nanowires, as demonstrated herein. The key issue in the growth method is the low temperature when depositing the first facet layer to provide for initial surface driven growth of small crystal grains of the facet layer. Thus, after the elongated nanostructures have been grown, all sources (e.g. in an MBE chamber) must be shut off such that the growth chamber is empty and then lowering the temperature, which can be lowered to below 0° C. or much lower, within seconds or minutes if external cooling sources like liquid nitrogen is used.

The background pressure may also be reduced before the provision of the first facet layer. If the process takes place in a vacuum chamber, the background pressure may be reduced. This may also help to prevent any material sticking at the nanowire surface before the first facet layer is deposited. The presently disclosed method may be seen as a method for producing a metallic/superconductor contact and/or interface to a semiconductor hybrid nanostructure (e.g. a nanowire).

Hence, a hybrid nanostructure may be manufactured in a vacuum chamber by means of vapour liquid solid (VLS) growth and molecular beam epitaxy (MBE), by a) growing by means of vapour liquid solid (VLS) growth, at an elevated temperature of above 400° C., one or more elongated crystalline nanostructures, such as nanowire (crystals), in the normal direction on a plane substrate, b) shutting off all sources of growth material and reducing the temperature thereby cooling the substrate with the crystalline nanostructures to a temperature below −30° C., and c) depositing a crystalline first facet layer directly on at least one plane surface, e.g. a side facet, of the crystalline nanostructures, preferably by means of MBE.

The method may be provided by means of vapour liquid solid growth and by means of molecular beam epitaxy. Hence, the plane substrate may be located in a vacuum chamber and may be prepared with catalysing particles, such as Au particles, which is a normal growth method of elongated crystalline nanostructures.

In order to hit a plane surface, e.g. the side facet(s) of the elongated crystalline nanostructures when growing the first facet layer, the source of the facet layer may be located at a finite angle, e.g. less than 10 deg or less than 5 deg, such as 2-3 degrees, (e.g. inside an MBE vacuum chamber) to the normal direction of the substrate during deposition of the facet layer. In order to cover additional side facets of the elongated crystalline nanostructures the substrate may be rotated during deposition of the facet layer.

As also stated previously the temperature of the substrate before deposition of the facet layer may preferably be reduced to a temperature below 10° C., or below 0° C., or below −5° C., or below −10° C. or below −15° C., or below −20° C., such as below −25° C., more preferably below −30° C. These low temperatures have been realized in a standard MBE chamber by reducing the background pressure and waiting for several hours. However, the temperature may be reduced much faster by applying an external source of cooling, e.g. liquid nitrogen, to cool the substrate. Even lower temperatures for depositing/growing the facet layer can then be reached. However, most importantly the time to reach the low temperatures can be much reduced.

The thickness of the metal phase on the nanowire facets is given by, $s(t)=\chi\Omega_S \sin(\varphi) f \cdot t$, where $\Omega_S$ is the atomic volume, $\varphi$ is the angle of the incoming beam with respect to the facet normal, f the incoming flux of growth species, and $\chi$ is a correction factor for the time the beam is effectively hitting the facets. The corresponding planar growth rate ($\Omega_S f \cos(\varphi)$) for the Al growth was 0.3-0.5 µm/hr. After growth the substrate can be turned away from the sources and put at room temperature in the buffer chamber, before any heat sources (power supply for substrate holder, ion gauges, light sources) are turned on in the growth chamber.

Epitaxial Domain Matching for Other Material Combinations

It may be difficult to predict material combinations which will form epitaxial interfaces. For example, surface diffusion lengths of metals on semiconductors are not generally available in the literature, and for a given metal, the large number of possible planes and surface orientations makes it difficult to predict domain matches. However, in the thick shell limit, where strain and grain boundary driven growth dominates, the lowest energy configuration is most likely when the SE and M crystals with similar symmetry groups (ZB or WZ and FCC) orientate along the same type of symmetry classes, especially if the bicrystal match is not to large. For nanowires grown in the conventional $[0001]_{WZ}/[111]_{ZB}$ direction, a cubic metal phase with the [11-2] normal to the facets and [111] along the nanowire axis is unique in that its symmetry allow large single crystal segments with simultaneous epitaxial match on all facets of the nanowire. Thus, it is natural to expect, that if this orientation matches the semiconductor for a particular metal, it is likely to form in the thick film limit. Thus it is interesting to search among the cubic metals for matches in this orientation. FIGS. 9, 10 and 11 list the domain strains for a range of metals grown on the important cases of InAs, InSb, and GaAs. In the general notation $$\left(\frac{n_{M,\square}}{n_{SE,\square}}, \varepsilon_\square\right) \times \left(\frac{n_{M,\perp}}{n_{SE,\perp}}, \varepsilon_\perp\right),$$

we distinguish between interfacial match of interfacial units in the components and the corresponding strain along the length and along the transverse direction to the NW, as expected from relaxed bulk values.

If ZB and FCC orientation along the same type symmetry classes, the two numbers are identical in the parallel and perpendicular directions. FIGS. 9-11 suggest possible feasible material combinations—combinations without match in the figures may form epitaxial interfaces in other orientations.

Fabrication of Electrical Devices

After growth the elongated hybrid nanostructure can be liberated from their growth substrate by a brief sonication in e.g. methanol, and a small amount of the resulting suspension can subsequently be deposited on doped Si substrates capped with 500 nm $SiO_2$. The resulting superconducting wires can then be located with respect to predefined alignment marks using optical dark field microscopy and the ends of the wires can be contacted using electron beam lithography (e.g. 6% copolymer, 4% poly-[methyl methacrylate] (PMMA)) and electron beam evaporation of ~5/100 nm of Ni/Au or Ti/Au (AJA International, ATC ORION evaporator). The oxide on the Al surface can be removed by Kaufmann argon ion milling performed inside the metal evaporation chamber (For Al: 300 Volts acceleration, 46 mA emission current, 120 sec of ion milling, this procedure reproducibly created contact to an Al shell).

For the devices with exposed semiconductor, i.e. with the superconductor material removed, narrow etch windows can be defined in 4% PMMA resist by e-beam lithography, and in order to remove the facet layer, e.g. by a ~2 sec etch in 12% hydrofluoric acid in the case of Al. The device can subsequently be coated in 20-30 nm of hafnium oxide using atomic layer deposition. In order to aid electrical contacts, the second lithography step may be obsolete as the first facet layer can act as the etch mask for exposing the semiconductor below. Low temperature electrical measurements can be performed in a dilution refrigerator (e.g. Leiden Cryogenics or Oxford Triton), for example using Stanford SR830 lock-ins with a 10 µV ac excitation.

Further aspects of the present disclosure relate to various applications of the hybrid nanostructure, e.g. a quantum point contact comprising a hybrid nanostructure as herein disclosed having a semiconducting core and a superconducting facet layer. E.g. a quantum point comprising a first section where the semiconducting core has been exposed and brought in contact with a normal conductor, such as Au, a second section where the semiconducting core is exposed, i.e. superconducting material is removed, and a third section wherein the superconducting surface of the nanoscale device is brought in contact with a superconductor. A further application is a superconducting field effect transistor comprising one or more of the presently disclosed hybrid nanostructures and/or electrical devices/contacts, e.g. a tuneable Josephson junction.

JJ Manufacturing Process

An elongated hybrid nanostructure with semiconductor and superconductor materials may be provided by means of the method described above. In order to provide a Josephson junction the superconductor material(s) must be removed from a segment of the nanostructure to create the weak link. This may be provided by means of a resist mask, such as for example PMMA. The length of the etched segment may be controlled by the dimensions of the resist mask and/or the etch solution, such as the concentration and the temperature. The amount of the undercut of the etched segment may be controlled by the etch-time.

Superconducting contacts may be made to the superconductor material of the hybrid nanostructure, using in situ ion milling to remove the native oxide prior to provision of the contacts which may be provided by means of deposition. Alternatively, the contacts may be formed by anodizing the superconductor surface using either resist or thick contacts as a masking layer. The anodized surface may be used as a gate dielectric. In a second alternative, dry-etching may also be used to form contacts.

Prior to using a resist mask in the step of etching and/or forming contacts, there may be a step of baking the chip, preferably at a temperature above 100° C., on which one or more of the structure are located and/or formed, for example in a time less than 10 minutes, such as 9 minutes, such as 8 minutes, such as 7 minutes, such as 6 minutes, such as 5 minutes, such as 4 minutes, such as 3 minutes, such as 2 minutes or such as 1 minute. The baking may be at a temperature between 170° C. and 200° C., preferably around 185° C.

A resist may be applied by a spin-on method, for example using an A4 resist, or an EL9 resist. The spin-on method may be varied in angular speed and time. Preferably, the angular speed may be between 2000 rpm-6000 rpm, such as 4000 rpm. The time may preferably be between 30 seconds and 2 minutes, more preferably between 30 seconds and 1 minute, most preferably around 45 seconds. After applying the resist there may be a further step of baking the structure for example in a time less than 10 minutes, such as 9 minutes, such as 8 minutes, such as 7 minutes, such as 6 minutes, such as 5 minutes, such as 4 minutes, such as 3 minutes, such as 2 minutes or such as 1 minute. The baking may be at a temperature between 170° C. and 200° C., preferably around 185° C. Further, after baking there may be a step of exposing an area structure. The area may be defined by a window and the system in general, for example a 100 keV e-beam system may be used. Also the exposure dosage may be defined depending on the e-beam system. For example, using the 100 keV e-beam system, the dosage may be between 600 µC/cm$^2$ and 1800 µC/cm$^2$, most preferably around 1200 µC/cm$^2$.

Examples with more details on how to prepare JJ and a contact, are given below in examples 5 and 6.

EXAMPLES

An example of the presently claimed tuneable Josephson junction was realized by means of an InAs nanowire with an epitaxial layer of Al. This tuneable JJ was used to provide side gate controlled transmon qubit, i.e. a gateable transmon qubit, aka a "gatemon" qubit. In the following examples the characterization of the JJ and the transmon qubit is demonstrated.

Example 1

A Side Gate Controlled Transmon Qubit

FIG. 1(A) shows a scanning electron micrograph of hybrid nanostructure in the form of an InAs—Al nanowire with a semiconductor weak link where the Al has been removed forming a Josephson junction. The weak link is formed by wet-etching a segment (~180 nm) of the epitaxial Al shell. The inset shows a transmission electron micrograph of the epitaxial InAs/Al interface. The epitaxial interface between the superconducting Al the semiconductor InAs is leading to a proximity induced gap in the InAs core with a low density of states below the superconducting gap (a hard gap). The InAs nanowire is formed by MBE growth and is approximately 75 nm in diameter, with an in situ grown ~30 nm thick Al shell.

FIG. 1(B-C) show optical micrographs of the completed tunable Josephson junction device according to the present disclosure. The total capacitance of the tunable Josephson junction, i.e. of the side gate controlled transmon qubit, $C_T$, is determined by the capacitance of the T-shaped Al island to the surrounding Al ground plane. The center pin of the coupled transmission line cavity is indicated in FIG. 1(C). The coherence time is in the order of 1 µs. The device as shown here is coupled to a λ/2 superconducting transmission line cavity with a bare resonance frequency $f_C$=5.96 GHz and quality factor, Q~1500. Both the cavity and qubit leads are patterned by wet etching an Al film on an oxidized high resistivity Si substrate. The nanowire contacts and gate are also patterned from Al using a lift-off process with an ion mill step to remove the native $Al_2O_3$ prior to deposition.

FIG. 1(D) shows a schematic of the readout and control circuit. The cavity is used for dispersive readout of the qubit with homodyne detection. A supercurrent leaking through the semiconductor core links the un-etched regions and determines the Josephson coupling energy, $E_J(V_G)$, which can be tuned by changing the electron density in the semiconductor core with a nearby side gate voltage, $V_G$.

Example 2

Strong Coupling to a Side Gate Controlled Transmon Qubit

Figure 2:
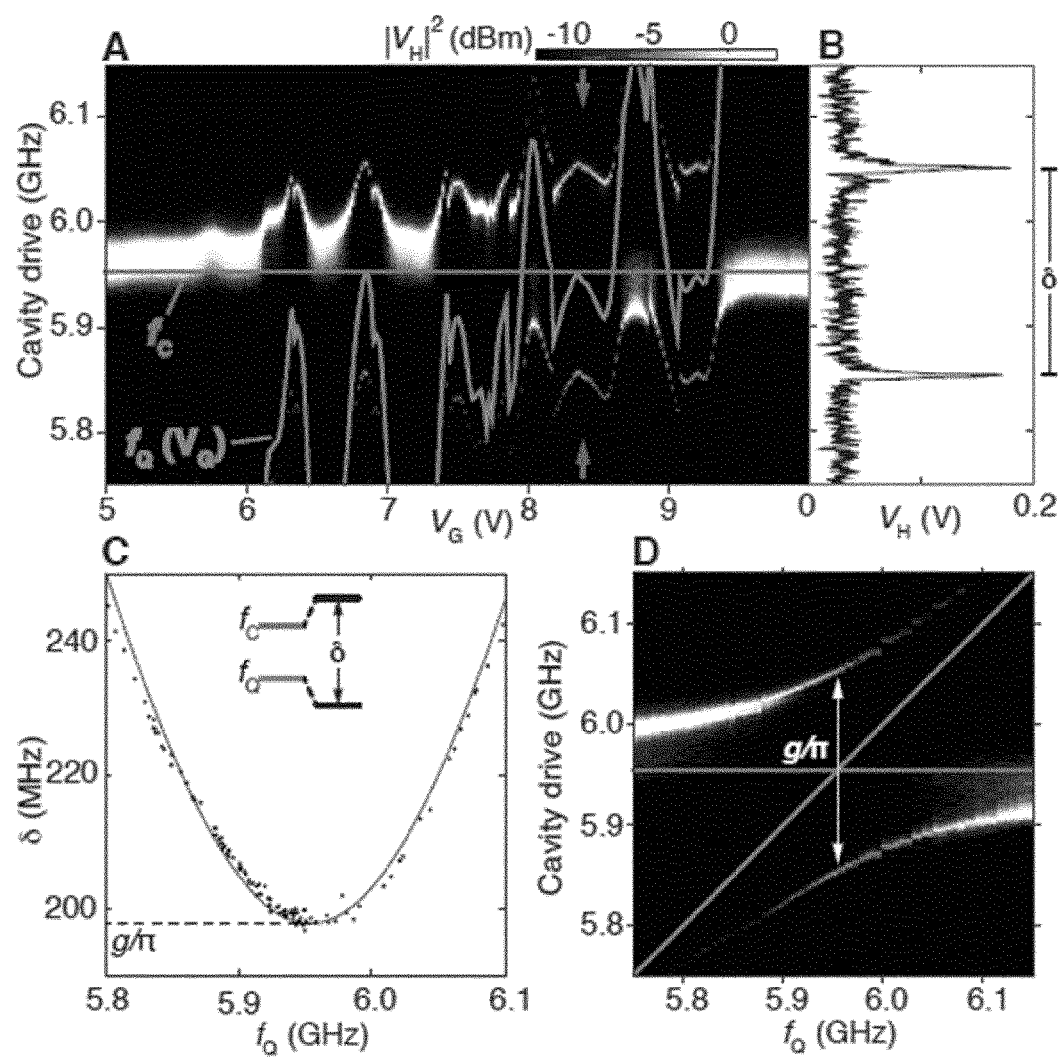
FIG. 2 shows an example of strong coupling to a side gate controlled transmon qubit according to the present invention.

Side gate controlled transmon cavity coupling is investigated by measuring cavity transmission at low drive power as a function of the cavity drive frequency and gate voltage, $V_G$, with $f_Q \sim f_C$ (FIG. 2(A)). The solid blue line shows the bare cavity resonance frequency, $f_C$, while the solid green line indicates the gate-voltage dependent qubit frequency, $f_Q(V_G)$, extracted from the data.

FIG. 2(B) shows cavity transmission as a function of the cavity drive at the position indicated by the purple arrows in (A). Aperiodic fluctuations in the resonance as a function of $V_G$, with regions of widely split transmission peaks, has been observed (FIG. 2B). These gate-dependent, repeatable fluctuations in the cavity resonance are associated with mesoscopic fluctuations in the nanowire transmission appearing also as fluctuations of normal-state conductance, $G_N(V_G)$ which causes fluctuations in the side gate controlled transmon frequency. The changing qubit frequency, in turn, pulls on the cavity resonance, resulting in the observed response. The split cavity peaks indicate hybridized qubit and cavity states in the strong coupling regime. The coupling strength, g, is found to exceed the qubit and cavity decoherence rates, allowing the vacuum Rabi splitting to be resolved.

FIG. 2C shows frequency splitting between the hybridized qubit-cavity states as a function of fQ, as extracted from (A). From fitting to the data, it can be extracted, that $g/2\pi=99$ MHz.

FIG. 2D shows a parametric plot of the data from (A) as a function of the cavity drive and qubit frequency, fQ. The plot reveals the avoided crossing for the hybridized qubit-cavity states.

Example 3

Coherent Control of a Side Gate Controlled Transmon Qubit

Figure 3:
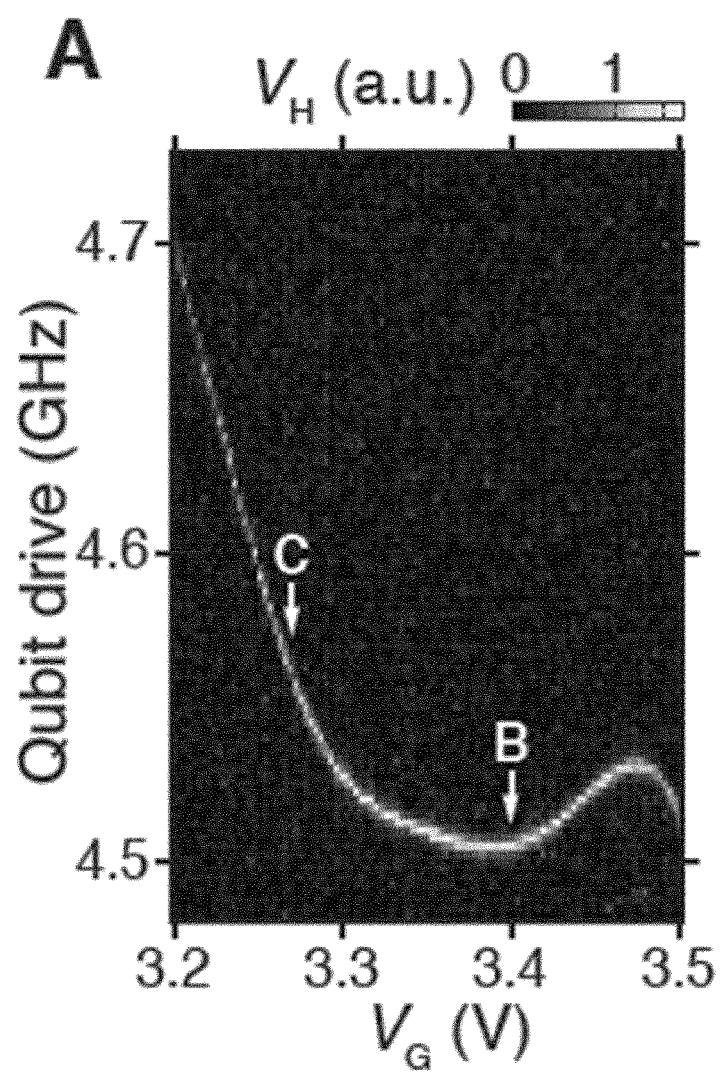
FIG. 3 shows an example of coherent control of a side gate controlled transmon qubit according to the present invention.

FIG. 3(A) shows the qubit resonance frequency as a function of gate voltage, $V_G$, and is observed as a distinct feature. Demonstrations of qubit control has been performed in the dispersive regime, $f_Q-f_C \gg g/2\pi$. $f_Q$ is obtained by measuring the qubit-state dependent cavity response following a second 2 μs microwave tone. When the qubit drive was on resonance with $f_Q$, a peak in the cavity response was observed, yielding a reproducible gate voltage dependence.

Figure 4:
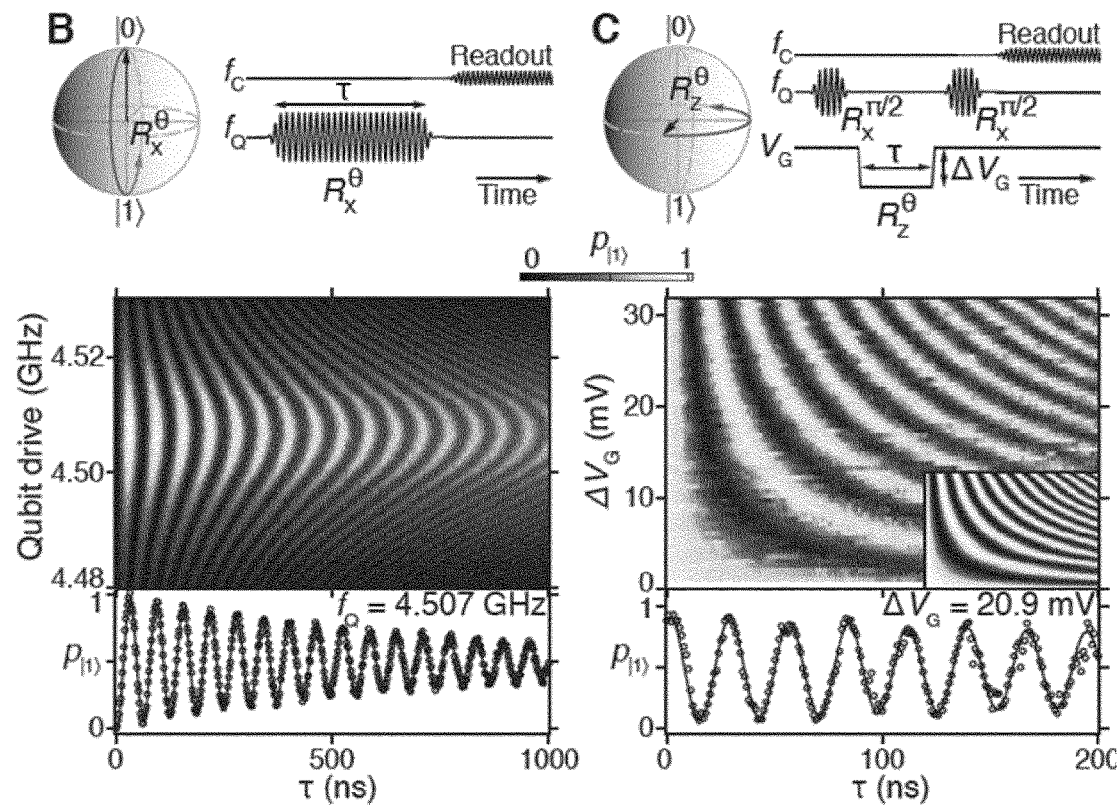
FIG. 4 shows further details of the above example of coherent control of a side gate controlled transmon qubit according to the present invention.

FIG. 4(B) shows coherent Rabi oscillations performed at point B in (A) ($V_G=3.4$ V) by applying microwave pulse for time, τ, to drive the qubit followed by a readout microwave pulse to probe the cavity response. The main panel shows coherent qubit oscillations as a function of driving frequency and r. The lower panel shows coherent oscillations at the qubit resonant frequency, corresponding to rotations about the X-axis of the Bloch sphere.

FIG. 4(C) shows coherent oscillations about the Z-axis of the Bloch sphere performed at point C in 3(A) (VG=3.27 V) by applying a gate voltage pulse, $\Delta V_G$, to detune the qubit resonance frequency for time, τ. A 15 ns microwave pulse is first applied to rotate the qubit into the X-Y plane of the Bloch sphere and, following the gate pulse, a second microwave pulse is used to rotate the qubit out of the X-Y plane for readout. The main panel shows coherent Z rotations as a function of $\Delta V_G$ and τ. The main panel inset shows the simulated qubit evolution based on $\Delta f_Q(V_G)$ extracted from 3(A). The lower panel shows coherent Z oscillations as a function of τ for $\Delta V_G=20.9$ mV. In both 4(B) and 4(C) the demodulated cavity response, $V_H$, is converted to a normalized qubit state probability by fitting X rotations to a damped sinusoid. The solid curves in the lower panels of 3(A) and 4(B) are also fits to exponentially damped sine functions. The observed precession frequency is consistent with the $\Delta f_Q$ predicted from the spectroscopy data in FIG. 3(A) (FIG. 4(C) main panel inset).

Example 4

Quantum Coherence in a Side Gate Controlled Transmon Qubit

Figure 5:
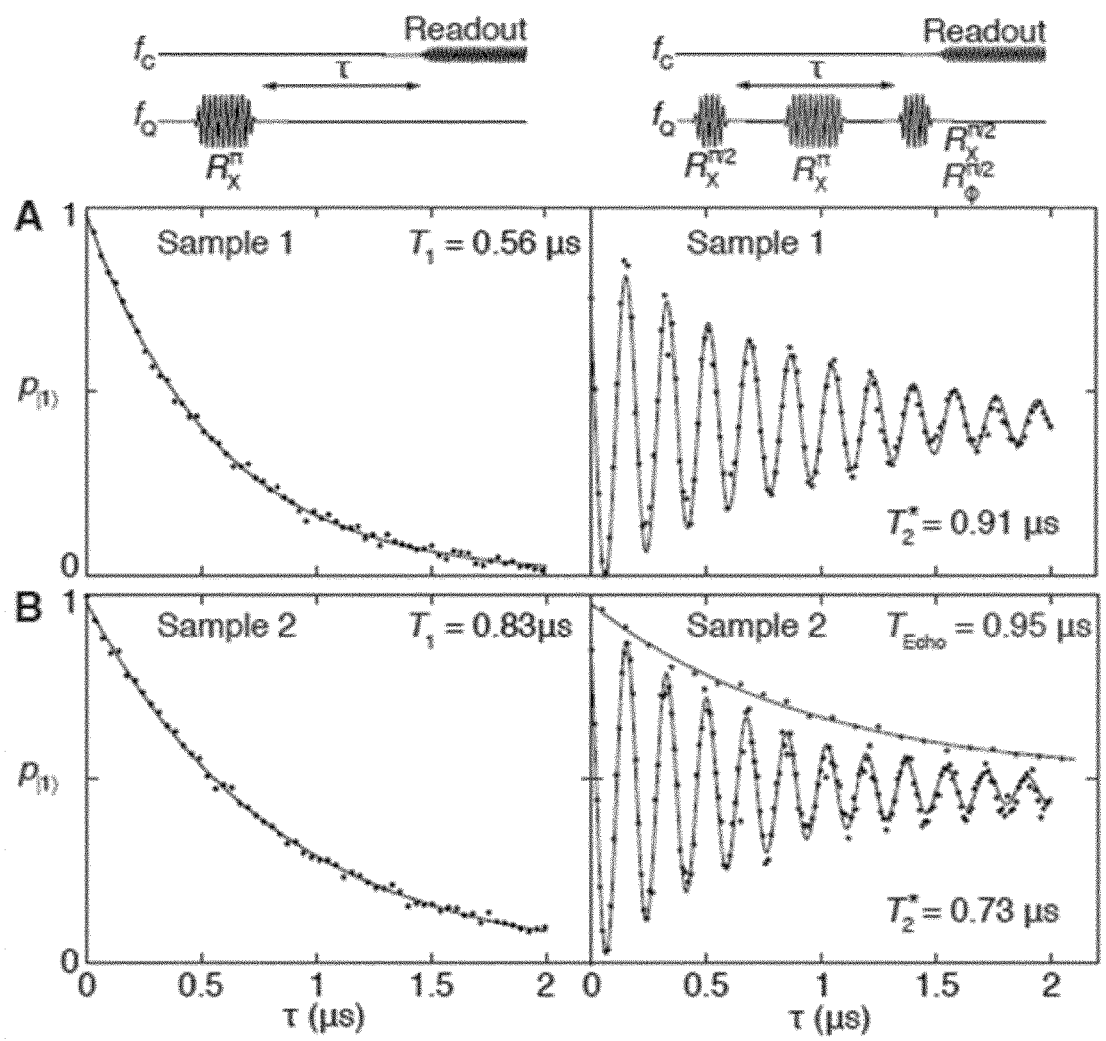
FIG. 5 shows an example of quantum coherence in a side gate controlled transmon qubit according to the present invention.

FIG. 5(A) shows in the left panel a lifetime measurement for Sample 1 at point B in FIG. 3A ($V_G=3.4$ V). A 30 ns pulse excites the qubit to the |1>-state and we vary the wait time, τ, before readout. The solid line is a fit to an exponential curve. The right panel shows a Ramsey experiment used to determine $T_2^*$ for Sample 1 with the wait time, τ, between two slightly detuned 15 ns pulses varied before readout. The solid curve is a fit to an exponentially damped sinusoid.

If FIG. 5(B) the lifetime and Ramsey experiments are repeated as in (A) for Sample 2 with $f_Q=4.426$ GHz ($V_G=-11.3$ V). In red, is performed a Hahn echo experiment by inserting a pulse between two. The decay envelope is measured by varying the phase, φ, of the second π/2 microwave pulse and extracting the amplitude of the oscillations. The solid red line is a fit to an exponential curve

Example 5

Recipe for Etching

Resist Mask:
  Prebake chip for 1 min at 185 C
  Spin A4 resist 4000 rpm 45 s
  Bake for 4 min at 185 C
Ebeam Exposure:
  Define windows for etch. We used a 100 keV ebeam system.
  Dose 1200 uC/cm2
Develop:
  60 s MIBK:IPA 1:3
  10 s IPA
  Dry with nitrogen
  O2 plasma clean
Etch
  12 s Transene Aluminum Etchant type D at 50 C
  30 s DI water room temperature
  10 s IPA
  dry with nitrogen
  Remove resist mask in acetone

Example 6

Recipe for Providing a Contact and Deposition of a Gate

Resist Mask:
  Prebake chip for 1 min at 185 C
  Spin EL9 resist 4000 rpm 45 s
  Bake for 1 min at 185 C
  Spin A4 resist 4000 rpm 45 s Bake for 4 min at 185 C
Ebeam Exposure:
　　Dose 1200 uC/cm2
Develop:
　　60 s MIBK:IPA 1:3
　　10 s IPA
　　Dry with nitrogen
　　O2 plasma clean
Metal deposition with ebeam evaporation system:
　　Argon ion milling to remove aluminum oxide
　　1 nm Ti
　　150 nm Al
　　Lift off in acetone

What is claimed is:

1. A side gate controlled charge qubit comprising
   a superconducting island,
   a superconducting electrode,
   a Josephson junction interconnecting the island and the electrode, the Josephson junction comprising a semiconductor weak link and an electrostatic side gate, and
   a main gate voltage coupling the superconducting island and the superconducting electrode by means of a main gate capacitance,
wherein the charge qubit is configured such that the electron density in the semiconductor weak link is controlled by tuning the voltage of the electrostatic side gate.

2. The side gate controlled charge qubit according to claim 1, wherein the Josephson junction comprises an elongated hybrid nanostructure comprising superconductor and semiconductor materials and a weak link, wherein the weak link is formed by a semiconductor segment of the elongated hybrid nanostructure wherein the semiconductor material is exposed to provide a semiconductor weak link.

3. A side gate controlled transmon qubit comprising
   a superconducting island,
   a superconducting electrode,
   a Josephson junction interconnecting the island and the electrode, the Josephson junction comprising a semiconductor weak link and an electrostatic side gate,
   a shunting capacitance shunting the superconducting island to ground, and
   a main gate voltage coupling the superconducting island and the superconducting electrode by means of a main gate capacitance,
wherein the transmon qubit is configured such that the electron density in the semiconductor weak link is controlled by tuning the voltage of the electrostatic side gate.

4. The side gate controlled transmon qubit according to claim 3, wherein the Josephson junction comprises an elongated hybrid nanostructure comprising superconductor and semiconductor materials and a weak link, wherein the weak link is formed by a semiconductor segment of the elongated hybrid nanostructure wherein the semiconductor material is exposed to provide a semiconductor weak link.

5. A Josephson junction comprising an elongated hybrid nanostructure comprising superconductor and semiconductor materials with an interface therebetween and a weak link, wherein the weak link is formed by a semiconductor segment of the elongated hybrid nanostructure wherein the semiconductor material is exposed to provide a semiconductor weak link, and wherein the interface between the superconductor and semiconductor materials is configured such that a superconductor hard gap can be induced in the semiconductor.

6. The Josephson junction according to claim 5, wherein the elongated hybrid nanostructure comprises a crystalline semiconductor nanostructure and a crystalline structured first facet layer of a superconductor material and wherein the crystalline structure of the semiconductor nanostructure is epitaxially matched with the crystalline structure of the first facet layer on the interface between the two crystalline structures.

7. The Josephson junction according to claim 6, wherein the epitaxial match between the crystalline structures of the semiconductor nanostructure and the first facet layer is configured to induce a superconductor hard gap in the semiconductor nanostructure by proximity of the superconductor.

8. The Josephson junction according to claim 6, wherein each two-dimensional interface between a plane surface of the crystalline semiconductor nanostructure and the first facet layer is domain matched and/or lattice matched in at least one dimension.

9. The Josephson junction according to claim 6, wherein each two-dimensional interface between a plane surface of the crystalline semiconductor nanostructure and the first facet layer is domain matched and lattice matched in both dimensions.

10. The Josephson junction according to claim 6, wherein the crystal structure of the crystalline semiconductor nanostructure and the crystal structure of the first facet layer belong to different lattice systems.

11. The Josephson junction according to claim 6, wherein the Bravais lattice of the crystalline semiconductor nanostructure is different from the Bravais lattice of the first facet layer.

12. The Josephson junction according to claim 6, wherein the superconductor material and/or the first facet layer comprises a metal.

13. The Josephson junction according to claim 6, wherein the superconductor material and/or the first facet layer comprises a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W.

14. The Josephson junction according to claim 6, further comprising a second facet layer of a superconductor material covering at least a part of the first facet layer.

15. The Josephson junction according to claim 14, wherein the second facet layer has a crystalline structure which is not epitaxially matched with the crystalline structure of the semiconductor nanostructure or with the crystalline structure of the first facet layer.

16. The Josephson junction according to claim 5, wherein the elongated hybrid nanostructure comprises:
   an elongated crystalline semiconductor nanostructure having a plurality of substantially plane side facets, and
   a crystalline superconductor first facet layer covering one or more of said plane side facets of at least part of the length of the crystalline semiconductor nanostructure,
   wherein the crystalline structure of the semiconductor nanostructure is epitaxially matched with the crystalline structure of the first facet layer on the interface of at least one side facet, and
   wherein the weak link is formed by a semiconductor segment of the elongated hybrid nanostructure where the semiconductor material is exposed to provide a semiconductor weak link.

17. The Josephson junction according to claim 5, wherein the crystalline semiconductor nanostructure is provided in a semiconducting material selected from the collection of group III-IV combinations, group IV elements, group IV combinations, group II-VI combinations and group I-VII combinations.

18. The Josephson junction according to claim 5, wherein the cross-section of the crystalline semiconductor nanostructure is square providing a total of four side facets or hexagonal providing a total of six side facets.

19. A tuneable Josephson device comprising the Josephson junction according to claim 5 and an electrostatic side gate located adjacent to the weak link of the Josephson junction and configured to apply and control a voltage across the weak link.

20. The tuneable Josephson device according to claim 19, wherein the electrostatic side gate is configured to control the electron density in the semiconductor weak link by tuning the voltage of the electrostatic side gate.

* * * * *